United States Patent [19]
Calabro

[11] 3,967,874
[45] July 6, 1976

[54] UNIFORMLY COOLED PRINTED CIRCUIT BOARD MOUNTING ASSEMBLY

[76] Inventor: Anthony D. Calabro, 8738 West Chester Pike, Upper Darby, Pa. 19082

[22] Filed: Sept. 30, 1975

[21] Appl. No.: 618,026

[52] U.S. Cl. .......................... 339/112 R; 339/17 M; 317/100
[51] Int. Cl.² ........................................ H01R 13/00
[58] Field of Search ........ 339/112 R, 17 LM, 17 M, 339/17 C, 17 R; 317/100, 101 R

[56] References Cited
UNITED STATES PATENTS

| | | | |
|---|---|---|---|
| 3,277,346 | 10/1966 | McAdam et al. | 317/100 |
| 3,904,262 | 9/1975 | Cutchaw | 339/112 R X |
| 3,915,307 | 10/1975 | Agarde | 339/17 M X |

Primary Examiner—Roy Lake
Assistant Examiner—DeWalden W. Jones
Attorney, Agent, or Firm—Anthony J. Casella

[57] ABSTRACT

Apparatus for uniformly cooling an array of printed circuit boards mounted in a card holding means includes a high velocity centrifugal fan which is in communication with a plenum chamber secured to the lower end of the card holding means. Disposed in the plenum chamber is a perforated screen configured to include a series of crests and troughs which operate as baffle means for providing resistance to the flow of high velocity air from the blower. The screen causes turbulence which reduces the velocity and uniformly directs the airflow through openings in the plenum chamber to the spaces between the array of printed circuit boards. The airflow thus divided cools each card on both sides as the air flows from bottom to top, thereby displacing the warmer air heated by the components mounted on the printed circuit boards.

13 Claims, 3 Drawing Figures

UNIFORMLY COOLED PRINTED CIRCUIT BOARD MOUNTING ASSEMBLY

The present invention relates to a new and improved apparatus for uniformly cooling a plurality of printed circuit boards mounted in a card holding means, commonly referred to as a cage in the electronics industry.

In large printed circuit board installations wherein a great number of printed circuit boards or cards are mounted in a cabinet, it is normal practice to provide a main cabinet blower system to cool the entire cabinet. In view of the great number of assemblies within the cabinet, in many cases air intended to be circulated within the entire cabinet is blocked off by equipment chassis or other obstructions, thereby making it impossible to direct the airflow across all of the printed circuit boards, and this is particularly critical with an assembly of printed circuit boards having a large number of electrical components which generate an excessive amount of heat. Various systems for selectively cooling critical components include the use of individual heat dissipating devices, such as metallic heat dissipators for metal case transistors mounted on a printed circuit board. As an example, reference is made to the U.S. Pat. No. 3,896,481 which issued to Anthony D. Calabro on July 22nd, 1975, and is entitled "HEAT DISSIPATOR FOR METAL CASE TRANSISTOR."

Although individual heat dissipating devices of the type disclosed in the above patent are effective in cooling individual components on a printed circuit board, there are occasions when it is desired to provide additional cooling means to a specific array of circuit boards mounted in a large cabinet, or there are certain situations when an assembly includes only a few cages of printed circuit boards, and it is only necessary to provide forced air cooling for one of such assemblies. In such cases, it is usually uneconomical to provide a central cooling system for the entire cabinet containing the cages.

Thus, it is an object of the subject invention to overcome the shortcomings of the prior art devices, and more particularly to provide apparatus for mounting and providing uniform forced air cooling to an array of printed circuit boards mounted in a cage. More particularly, the subject invention provides the combination of a printed circuit board cage, for example, a standard 19 inch electronic cabinetry, including an elongated plenum chamber and a blower means to distribute air evenly over the entire array or rack of printed circuit cards. The elongated plenum chamber is secured to the lower end of the cage, extends generally perpendicular to the planes of the printed circuit boards, and has a perforated upper surface wherein openings are aligned with the spaces between the circuit boards. The blower means, in the form of a centrifugal fan, provides high velocity forced air to the plenum chamber wherein a baffle means is disposed and is operative to reduce the velocity of the air, create turbulence, and cause the air to be uniformly distributed through the perforated upper surface of the plenum chamber over the array of printed circuit boards mounted in the cage. Each printed circuit card is cooled on both sides, and the air flows from the bottom to the top of each card, thereby displacing the warmer air heated by the components on the card.

The subject invention allows an individual card cage to be cooled independently, and not rely solely on the cabinet blower to cool the entire cabinet. The subject blower means may be in the form of a centrifugal type fan capable of moving high velocity air into the uniquely baffled plenum chamber which reduces the velocity and distributes the air volume over the entire area of the array of printed circuit boards, so that each board is cooled equally. Preferably, the printed circuit board held in the cage by means of circuit board mounting devices of the type disclosed in applicant's U.S. Pat. No. 3,231,785 which issued to Anthony D. Calabro on Jan. 25, 1966 and is entitled "Circuit Board Mounting Device." Applicant's mounting devices have a 75% open design whereby the forced air can flow almost undisturbed over and pass the edge of each card with total effectiveness.

The centrifugal type blower preferably includes a foam filter over the blower intake to prevent dust from being blown over the printed circuit boards, and another feature of the centrifugal type blower is that it is of normally narrow planar design, thereby minimizing the amount of space taken up by the blower and leaving the maximum space for the array of printed circuit boards. In a preferred embodiment of applicant's device, the baffles are wave-like in configuration, having a plurality of crests and troughs which extend perpendicularly to the airflow from the centrifugal blower. The crests are configured to have sharp discontinuities in order to reduce the Bernoulli effect by the transverse airflow below on the vertical airflow through the perforated metal cover of the plenum chamber. The troughs of the baffles are curved, preferably, on a 1 and ½ inch radius to direct the faster airflow to the bottom of the plenum chamber, where it can be acted upon by the baffle.

Further details relative to the applicant's invention, as well as the advantages and objects thereof will become apparent from the reading of the following detailed description, taken in conjunction with the drawings in which.

Figure 1:
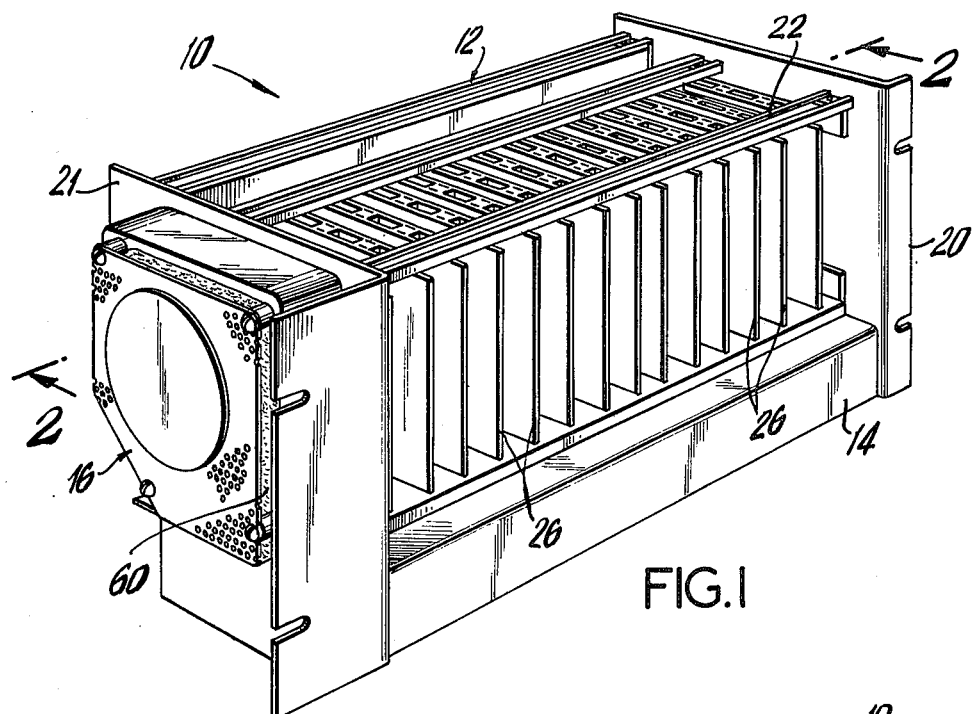
FIG. 1 is a perspective view of the apparatus of the subject invention.
Figure 2:
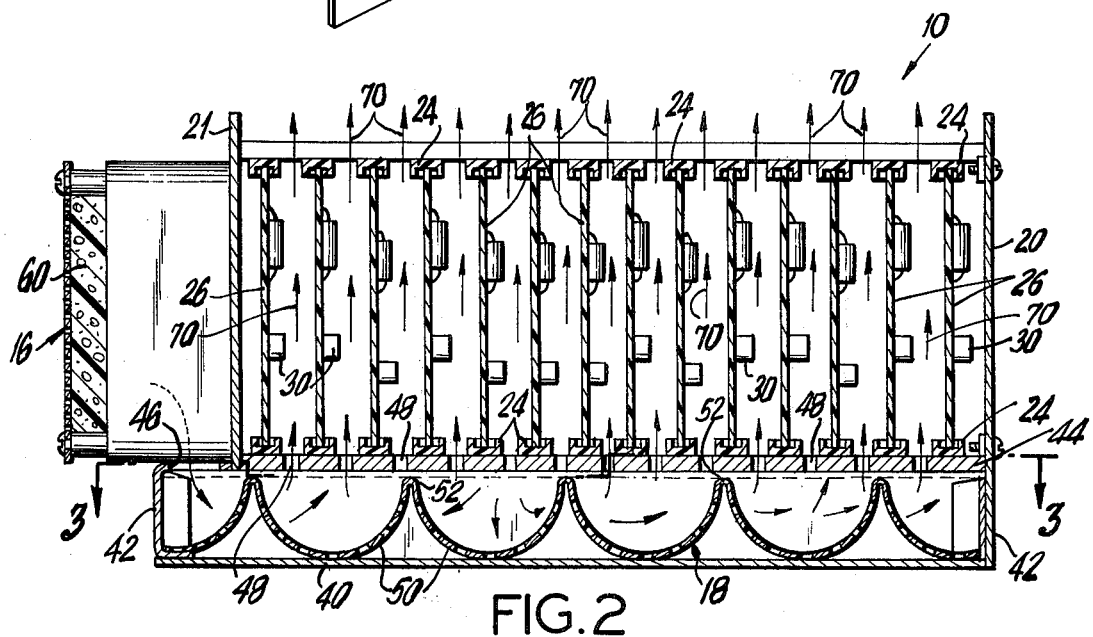
FIG. 2 is a cross-sectional view of the subject apparatus taken along line 2—2 in FIG. 1.

Referring to the figures, the uniformly cooled printed circuit board mounting assembly of the subject invention is designated by the numeral 10, and basically comprises a printed circuit board holding means or cage 12, a plenum chamber 14, blower means 16, and baffle means 18 (see FIGS. 2 and 3) disposed within the plenum chamber. Cage 12 includes end plates 20, 21 which are interconnected by parallel spaced members 22 which, in turn, support a plurality of circuit board mounting devices, designated by the numeral 24. The latter may be of the type disclosed in United States Letters Patent No. 3,231,785, with mounting devices 24 being disposed along the upper and lower portions of the cage 12 in order to hold a plurality of printed circuit boards or cards 26 in generally parallel array, with the planes of the boards extending generally vertically. As shown in FIG. 2, each printed circuit board or card has mounted thereon a plurality of electronic components, generally designated by the numeral 30 which, in operation, generate heat, and in order to maintain the efficiency of such electrical components, it is desirable to continuously cool the components by convection cooling.

Figure 3:
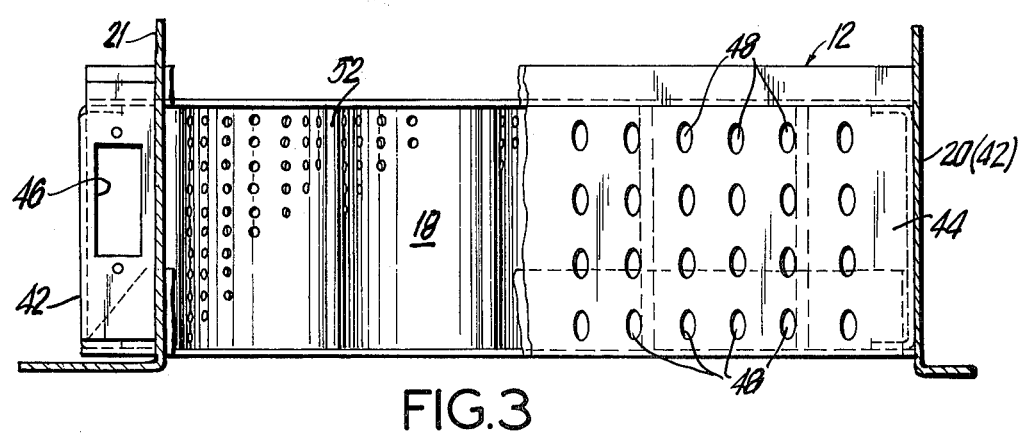
FIG. 3 is a sectional view of the plenum chamber of the subject apparatus taken along line 3—3 in FIG. 2.

Uniform cooling of the components 30 is achieved by the subject apparatus by the operation of the plenum chamber 14 including baffle means 18, and the blower means 16. More particularly, plenum chamber 14 comprises a generally elongated rectangular structure having a closed bottom 40 and closed sides 42, with the upper portion of the plenum chamber including a plate 44 having a first opening 46 which is in communication with the blower means 16. In addition plate 44 includes an array of openings 48 which are aligned with the spacings between the generally parallel printed circuit boards 26 (see FIGS. 2 and 3). Disposed within the plenum chamber 14 is baffle means 18 which is operative to generate turbulence of the forced air from the blower means 16, and to cause the air to be uniformly distributed over the array of printed circuit boards 26. More particularly, baffle means 18 may be in the form of a metallic screen, such as an aluminum screen material having 200 openings per inch, and configured in a wavelike manner defining a plurality of troughs 50 and sharp edged crests 52. As shown in FIGS. 2 and 3, the crests 52 extend generally parallel to the planes of the printed circuit boards, and the crests are disposed slightly below the upper plate 44 of the plenum chamber. Blower means 16 may be secured to end plate 20, and has its outlet in communication with the first opening 46 in the upper plate 44 of the plenum chamber. Preferably the blower means 16 is a centrifugal type fan capable of moving 25 cubic feet per minute into the uniquely baffled plenum chamber, and is of compact design. As an example, a centrifugal type fan manufactured by Rotron Incorporated of Woodstock, New York may be employed, as it has the capacity to move 25 cubic feet per minute, has a small size on the order of 4.75 inches square by 1.56 inch in depth, has a low acoustical rating, and weighs only 19 ounces. Preferably, a foam filter 60 is fitted over the blower intake to prevent dust from being blown over the printed circuit boards. The narrow configuration of the blower means 16 is advantageous in that it only occupies the space normally taken up by two printed circuit cards in a standard 19 inch electronic cage. It is also noted that the baffle means 18 also functions to act as an air filter preventing dust and other forms of impurities from being blown over the printed circuit cards.

As illustrated in FIG. 2 by the flow lines 70, air is drawn through the foam filter 60 and compressed by the centrifugal fan 16 to a high velocity, after which it passes through opening 46 to the plenum chamber 14. In order to evenly cool the rack of printed circuit boards, the volume of air output from the blower means, which is a constant parameter, must be converted from the narrow stream of high velocity air from the blower to an airflow at a resultant low velocity across the wide area of the base of the cage. The tradeoff of velocity for wider coverage is accomplished by the subject plenum chamber 14, which is constructed in such manner as to provide resistance to the flow of air from the blower means to the spaces between the printed circuit boards. This resistance comes from the baffle means 18 which is a system of grid-like baffles having over 200 passages for airflow per square inch. The baffle means 18 cause turbulence of the high velocity airflow, thereby reducing the velocity of the airflow and distributing the airflow over the desired area. The perforated metal cover or plate 44 of the plenum chamber then directs the airflow to the bottom edge of each card mounted in the cage. The airflow, thus divided, cools each card on both sides, as the air flows from the bottom to the top, displacing the warmer air heated by the electronic components 30 mounted on the printed circuit boards. It is also noted that in the creation of the turbulent flow of the high velocity air from the blower means, the baffle means 18 also operates to cause a buildup of pressure within the plenum chamber, thereby creating an effective back pressure which further enhances the uniform distribution of cool airflow to the spaces between the printed circuit boards.

As clearly indicated in FIG. 2, the crests 52 are defined by a sharp angle and the sharp discontinuities of the crests is effective in reducing the Bernoulli effect of the transverse airflow below the crests on the vertical airflow through the perforated metal plate 44. Preferably the troughs of the baffle are suitably curved, for example on a one and one-half inch radius, to direct the faster airflow to the bottom of the plenum chamber, where it is acted upon by the baffles and effectively slowed down while becoming turbulent airflow.

In actual tests conducted employing the subject invention, it was found that the efficiency of a transistor was improved markedly when mounted on a board disposed in the subject apparatus. More particularly a transistor was mounted in the center of a 4 ⅛ × 4 ⅝ inch G-10 board placed in the middle of the cage. The ambient temperature was 27°C and the power delivered to the transistor was 2 watts (0.05 amps; 40 volts). With no heat sink (of the type disclosed in applicant's U.S. Pat. No. 3,896,481), and without the blower means 16 on, the power dissipation in watts, at 100°C was only approximately 1.3. When the heat sink was applied at 100°C, the power dissipation in watts was increased to 2.2. When the blower means 16 was activated, the power dissipation was in excess of 3.5. Hence considering that heating of transistors above the optimum temperature not only impairs their effectiveness but in fact actually destroys the bond between the materials of the transistor, it is apparent that the subject invention markedly increases the efficiency and usefulness of the transistors.

Although the invention has been described with reference to several preferred embodiments, it is readily apparent that various modifications, adaptations, and alterations may be made by one skilled in the art, and hence the above should be interpreted as being illustrative only, and not in a limiting sense. For example, the subject invention may be constructed such that the blower means are disposed behind the cage, thereby providing additional lateral space for more printed circuit cards.

What is claimed is:

1. A uniformly cooled printed circuit board mounting assembly comprising the combination of:

printed circuit board holding means for maintaining a plurality of printed circuit boards in generally parallel array;

an elongated plenum chamber secured to the lower end of said holding means and extending generally perpendicular to the planes of said printed circuit boards;

blower means for providing forced air to said plenum chamber; and baffle means disposed in said plenum chamber and operative to generate turbulence of the forced air so as to cause the air to be uniformly distributed over the array of printed circuit boards.

2. A uniformly cooled printed circuit board mounting assembly as in claim 1 wherein said printed circuit boards extend generally vertically, with the forced air being introduced between the printed circuit boards at the lower ends thereof, and flowing upwardly displacing the warmer air heated by the components on the printed circuit boards.

3. A uniformly cooled printed circuit board mounting assembly as in claim 1 wherein said blower means comprises a centrifugal fan secured to the printed circuit board holding means.

4. A uniformly cooled printed circuit board mounting assembly as in claim 3 wherein said fan is generally planar, and is disposed generally parallel to the plane of the printed circuit boards, at one end of said holding means.

5. A uniformly cooled printed circuit board mounting assembly as in claim 1 wherein said elongated plenum chamber comprises a generally rectangular structure having a series of first openings along the upper portion thereof, which first openings are aligned with the spaces between the array of the printed circuit boards, and through which first openings the uniformly distributed air passes, and furthermore including a second opening in communication with the output of said blower means.

6. A uniformly cooled printed circuit board mounting assembly as in claim 1 wherein said baffle means comprises an elongated perforated screen configured to include a series of crests and troughs.

7. A uniformly cooled printed circuit board mounting assembly as in claim 6 wherein said crests and troughs extend generally parallel to the parallel array of the printed circuit boards.

8. A uniformly cooled printed cicuit board mounting assembly as in claim 6 wherein said crests are configured to have sharp angles to reduce the Bernoulli effect.

9. A uniformly cooled printed circuit board mounting assembly as in claim 1 wherein said baffle means is formed of a perforated aluminum screen material.

10. Apparatus for uniformly cooling printed circuit boards mounted in a cage such that the printed circuit boards are disposed in generally parallel array, said apparatus comprising:
   an elongated plenum chamber secured to the lower end of said cage, which plenum chamber includes openings which are in communication with the spacings between said printed circuit boards;
   blower means secured to and in communication with said plenum chamber for providing forced air thereto; and
   baffle means disposed in said plenum chamber and operative to uniformly distribute the forced air from said blower means through said openings in the plenum chamber to the spaces between said printed circuit boards.

11. Apparatus as in claim 10 wherein said baffle means comprises an elongated perforated screen configured to include a series of crests and troughs, which crests and troughs extend generally parallel to the parallel array of printed circuit boards.

12. Apparatus as in claim 11 wherein said crests are configured to have a sharp angle to reduce the Bernoulli effect.

13. Apparatus as in claim 10 wherein said baffle means is formed of a perforated aluminum screen material.

* * * * *